United States Patent [19]

Lockwood et al.

[11] 4,243,744

[45] Jan. 6, 1981

[54] MICROWAVE CURING OF PHOTORESIST FILMS

[75] Inventors: Harry F. Lockwood, New York; Thomas F. McGee, Harrison, both of N.Y.

[73] Assignee: Exxon Research & Engineering Co., Florham Park, N.J.

[21] Appl. No.: 972,259

[22] Filed: Dec. 22, 1978

[51] Int. Cl.³ .............................................. G03C 5/00
[52] U.S. Cl. ........................................ 430/325; 34/4; 34/39; 427/45.1; 427/46; 427/388.1; 430/313; 430/327; 430/328; 430/330; 430/935
[58] Field of Search ............... 34/4, 39; 219/10.55 R, 219/10.55 M; 427/45, 384, 385, 46; 96/27 R, 35.1, 67, 86 P; 430/313, 322, 323, 324, 325, 327, 328, 330, 935

[56] References Cited

U.S. PATENT DOCUMENTS

| | | | |
|---|---|---|---|
| 3,861,922 | 1/1975 | Minoda | 96/67 X |
| 3,884,692 | 5/1975 | Minagawa | 96/85 |
| 3,957,515 | 5/1976 | Robillard | 427/45 X |
| 4,055,001 | 10/1977 | Forster et al. | 34/4 X |
| 4,086,373 | 4/1978 | Tobias et al. | 427/45 X |
| 4,120,722 | 10/1978 | Okamoto et al. | 96/67 X |
| 4,149,322 | 4/1979 | Minoda et al. | 427/45 X |
| 4,154,612 | 5/1979 | Minoda et al. | 219/10.55 M X |

OTHER PUBLICATIONS

Karp, "Curing Photoresist Using Microwave Energy", 1970 International Hybrid Microelectronics Symposium, Nov. 1970.

Primary Examiner—Edward C. Kimlin
Attorney, Agent, or Firm—David W. Collins; Paul E. Purwin

[57] ABSTRACT

Microwave curing of photoresist films employed in processing semiconductor wafers provides an alternative to conventional drying techniques. The time of curing may be reduced from about 20 to 25 minutes required for conventional air drying to about 5 minutes employing microwave curing. Further, the photoresist film is the only part of the semiconductor assembly that experiences elevated temperatures. The remainder of the wafer remains near ambient conditions, without experiencing possible deleterious effects as a consequence of the high temperature processing.

4 Claims, No Drawings

MICROWAVE CURING OF PHOTORESIST FILMS

BACKGROUND OF THE INVENTION

1. Field of the Invention

The invention relates to processing of semiconductor devices and, in particular, to curing of photoresist films employed during such processing.

2. Description of the Prior Art

As is well-known, photoresist films find a variety of applications in semiconductor processing. Typically, photoresist solution is applied to a substrate and is pre-baked to drive off solvents, thus leaving a thin film as a residue. A pattern of some sort, for example, a circuitry pattern, is then overlaid over the film, and those portions not covered by the pattern are exposed to electromagnetic radiation, typically in the ultraviolet region of the spectrum, or to a beam of electrons of appropriate energy. During developing of the film employing conventional procedures, the exposed portions (positive resist) or the unexposed portions (negative resist) are removed. In the areas where the photoresist film has been removed, the underlying substrate becomes accessible for further processing. Such processing may involve, for example, the selective removal of an underlying oxide and the deposition of a metal contact. As a final step, the remainder of the photoresist film is removed.

During the course of the foregoing processing, there are drying or curing steps, so-called pre-bake and post-bake steps, which are conventionally carried out in air at about 95° to 120° C. for about 20 to 25 minutes. Such baking consumes a considerable portion of processing time and energy. Further, exposing the entire wafer to temperatures on the order of 120° C. tends to have a deleterious effect on certain finished devices.

Attempts have been made to speed up the baking process. For example, at the 1970 International Hybrid Microelectronics Symposium, Beverly Hills, CA, November 6–18, 1970, a paper was presented by J. Karp entitled "Curing Photoresist Using Microwave Energy". A general purpose microwave oven was disclosed for curing photoresist films deposited over metallized layers on insulating substrates. Drying time for the resist was given as approximately less than 20 seconds for films of about 1 $\mu$m thickness. The microwave oven used had a power output of 500 watts (nominal). The process was limited to a maximum time of about 20 seconds, as noted above, since curing cycles ranging between 1 and 5 minutes were found to burn the photoresist and/or destroy portions of underlying metallization. Following exposure of portions of the film and further photolithographic processing, the exposed portions of the cured film were then removed in a chemical etchant.

In contrast to the foregoing publication which discloses use of microwaves to cure photoresist films, Japanese Kokai 10-43079 discloses heating exposed photoresist films deposited on semiconductor layers by microwave radiation to damage the cross-linked structure of the film, which is then completely decomposed by ozone. The photoresist film can thus be easily removed without the use of chemical etchants.

SUMMARY OF THE INVENTION

In accordance with the invention, a process for curing at least a portion of a photoresist film comprises:

(a) applying a photoresist film to a surface of a substrate;
(b) curing the film by subjecting the photoresist-coated substrate to microwave radiation for a period of time sufficient to cure the film for subsequent processing;
(c) subjecting portions of the photoresist film either to electromagnetic radiation of sufficient intensity or to a beam of appropriately energetic electrons to expose portions of the photoresist film; and
(d) developing the photoresist film to remove portions thereof.

At a nominal power level of 400 watts and a frequency of 2.5 GHz, the minimum time required for adequate curing is about 3 minutes. While there appears to be no maximum time, economic considerations dictate a time shorter than about 20 minutes.

The photoresist film that is obtained is hard-baked and is more resistant to chemical attack than films prepared by conventional curing. During processing by microwave radiation, only the photoresist film experiences elevated temperatures; the remainder of the substrate remains near ambient temperature. Finished devices consequently may be expected to evidence enhanced reliability.

DETAILED DESCRIPTION OF THE INVENTION

The process that follows is given in terms of fabricating gallium arsenide devices, more specifically, gallium arsenide diode lasers of the heterostructure type. However, it will be appreciated that the disclosed method may be advantageously employed in processing semiconductor devices employing other materials such as gallium phosphide, silicon, germanium and the like. Such devices may optionally have an oxide film, native or otherwise, or a metal film covering at least portions of the semiconductor surface.

Gallium arsenide diode lasers typically comprise an n-type GaAs substrate, on at least a portion of which are normally grown four successive layers of n-(Al,Ga)As, p-GaAs [or p-(Al,Ga)As], p-(Al,Ga)As and p-GaAs as a cap layer. The layers of n-(Al,Ga)As and p-GaAs [or p-(Al,Ga)As] form a p-n junction, with central areas in the p-GaAs [or p-(Al,Ga)As] layer providing light emitting areas. The latter layer is often referred to as the active layer. The layers are conveniently formed one over the other in one process by liquid phase epitaxy (LPE) or vapor phase epitaxy (VPE). The LPE technique is generally carried out in a horizontal sliding boat apparatus containing four melts, as is well-known. Metal electrodes in the form of stripes parallel to the intended direction of lasing are deposited through conventional photolithography techniques onto the p-GaAs cap layer and provide means for external contact. A metal layer is deposited on at least a portion of the bottom of the substrate. Gold pads, somewhat smaller in area than the intended device, are sometimes formed on the metal layer and provide means for external contact. Like the metal electrodes, the gold pads are also formed by conventional photolithography techniques.

In the fabrication of stripes and pads, a photoresist, for example positive photoresist No. AS-1350J (available from Shipley Company, Newton, MA), is spun onto the wafer at a fairly high rate of speed for a short period of time. Customarily, the solution is spun on at about 6000 rpm for about 40 seconds. The spun-on photoresist film is then conventionally cured in a pre-baking step at about 95° to 120° C. in air for about 20 to 25 minutes in order to drive off the solvent. Typically, the thickness of the photoresist is about 1.4 μm.

In accordance with the invention, the photoresist film is cured employing microwave radiation for a period of time sufficient to cure the film for further processing.

The frequency of microwave radiation employed may be that commonly used in commercial microwave ovens. A suitable frequency is 2.5 GHz. The period of time of curing and the power experienced by the photoresist film are interrelated. However, due to the difficulty in measuring the power experienced by the photoresist film, that relationship is not easily specified. Rather, employing a particular microwave oven having a particular power output, the curing time should be sufficient such that further processing does not adversely affect the photoresist film. For example, contacting partially cured, exposed portions of a positive photoresist film with developer tends to undercut the unexposed portions, resulting in less control over subsequent metallization dimensions. Accordingly, simple experimentation involving curing times and subsequent process conditions will readily establish the minimum desirable curing time. For example, for a microwave oven having a nominal power output of 400 watts, the minimum curing time required is about 3 minutes. At that power level, less than 3 minutes results in a photoresist film that is not completely cured and is susceptible to undercutting during subsequent processing. Five minutes results in a cured film of the requisite properties and is accordingly preferred. The maximum time that may be used is largely dependent upon economic considerations. For example, curing the film for 20 minutes will effect no greater improvement in photoresist properties than curing for 5 minutes and is identical in time to prior art hot air baking. The process disclosed herein is also applicable to negative photoresists, employing the same conditions.

Any suitable apparatus generating microwave radiation in the range disclosed above will suffice in the practice of the invention. Advantageously, batch processing of semiconductor wafers may employ commercially available microwave ovens, which generally have a frequency in the range of about 2.5 GHz.

Portions of the cured photoresist films are then exposed to a photomask pattern employing conventional photolithographic techniques. Typically, an ultraviolet (about 365 nm) exposure of 3.4 mW/cm² for 30 seconds is employed. Alternatively, a beam of electrons having energies on the order of about 10 to 100 kV is typically employed.

The photoresist film is then developed in developer, commonly in an aqueous solution in a ratio of 1:1, for about 30 seconds, as is conventional. For a positive photoresist, the exposed portions are removed by the developer. For a negative photoresist, the unexposed portions are removed.

In the processing of gallium arsenide diode lasers, an oxide film is sometimes formed over the gallium arsenide layer. The oxide film may be either a native oxide, grown to a thickness of about 1250 Å, or a silicon oxide (SiO$_2$) layer that is grown to a thickness of about 1000 Å.

In the case of a native oxide film, during developing of the photoresist, the unwanted portions of photoresist are removed, along with portions of the native oxide that are exposed, thus exposing portions of the p-GaAs surface for subsequent metallization. A post-cure is then optionally performed, depending on the severity of the metallization process with respect to the remaining photoresist and native oxide films. The metallization process is conventional and forms no part of this invention.

Electroplating is a comparatively severe process, since the process tends to lift portions of the photoresist film and remove any exposed native oxide, thereby resulting in wider stripes than desired. A post-curing step, performed after the developing step, improves the adhesion of the photoresist film to the native oxide film. The post-cure operation may be done, as in the prior art, by baking in air at about 95° to 120° C. for about 20 minutes or, in accordance with the invention, employing microwave radiation as described above. After metallization of the exposed portions of the p-GaAs surface, the remaining photoresist is then removed.

For a less severe process, such as vacuum deposition, the remaining portions of the photoresist film may be removed without removing the remaining portions of the native oxide film. The metal may then be deposited directly on the native oxide and exposed portions of the p-GaAs layer.

In the case of SiO$_2$ films (or other non-native oxide films), during developing of the photoresist, the developing solution stops at the SiO$_2$ interface. A post-cure is then performed by microwave radiation as discussed above, followed by immersing the wafer in a suitable etchant, such as buffered HF solution, thus removing the exposed SiO$_2$ portions in preparation for metallization of the exposed portions of the p-GaAs layer. Again, the post-cure is employed to improve adhesion of the photoresist film to the oxide film in order to avoid formation of undesirably wide stripes.

EXAMPLES

Example 1

A gallium arsenide substrate (n-type) having layers of GaAs and (Al,Ga)As thereon was prepared. The final layer was p-GaAs. A layer of SiO$_2$ was deposited over the surface of the final layer. A film of photoresist (Shipley AZ-1350J) was formed on the SiO$_2$ surface by spinning at 6000 rpm for 40 sec. The assembly was cured in a microwave oven (400 W nominal power; 2.5 GHz frequency) for 2 min. A pattern of stripes was formed on the surface of the photoresist film by exposure for 30 sec at 3.4 mW/cm² (362 nm wavelength) through a mask of 10 μm wide stripes. The photoresist film was then developed in developer (Shipley AZ-1350J Developer), 1:1 dilution in water, for 1 min with agitation, thereby removing exposed portion of the photoresist. After rinsing in deionized water for 30 sec and blow drying in nitrogen, the assembly was post-cured in the microwave oven for 5 min. The underlying exposed portions of SiO$_2$ were removed in buffered HF (10 sec) to expose underlying portions of p-GaAs. After rinsing in deionized water and blow drying, the remaining resist was removed in acetone. The stripe widths were about 12.6 μm, or about 26% larger than mask size.

Example 2

A second GaAs substrate was processed as in Example 1, except that the microwave cure was performed for 3 minutes. The stripe widths were about 11.25 μm, or about 12.5% larger than mask size.

Example 3

A GaAs substrate was processed as in Example 1, except that the microwave cure was performed for 5 minutes and the exposure of the photoresist film through the mask to UV radiation was performed for 20 sec. The stripe widths were about 10.35 μm, or about 3.5% larger than mask size.

Example 4

A gallium arsenide substrate was prepared as in Example 3. Metallic stripes were then formed over the exposed portions of the p-GaAs layer to a thickness of about 1000 Å by plating a gold-containing film thereon. The gold film was also plated onto the entire n-side, which had previously been coated with a silver/tin film. The entire p-side was then protected by coating with a film of photoresist as in Example 1, except that the film was cured in the microwave oven for 5 min. The n-side (bottom of the substrate) was then coated with a photoresist film as in Example 1, followed by curing in the microwave oven for 5 min. A pattern of pads was formed on the photoresist surface on the n-side by exposure for 40 sec at 3.4 mW/cm² through a mask of 125 μm squares. The photoresist was then developed, rinsed and dried as in Example 1. The film was post-cured in the microwave oven for 5 min. A film of gold, about 1 to 2 μm thick, was electroplated onto the exposed portions of the n-side. After rinsing and drying, the remaining portions of the photoresist film on both sides were removed in acetone.

What is claimed is:

1. A process for curing at least a portion of a photoresist film which comprises:
    (a) applying a photoresist film having a thickness of about 1.4 microns to a surface of a substrate wherein said surface comprises an oxide layer;
    (b) curing the film by subjecting the photoresist-coated substrate to microwave radiation of a nominal power of about 400 watts for a period of time ranging about two minutes to about five minutes;
    (c) subjecting portions of the photoresist film either to electromagnetic radiation of sufficient intensity or to a beam of appropriately energetic electrons to expose portions of the photoresist film; and
    (d) developing the photoresist film to remove portions thereof.

2. The process of claim 1 in which following development of the photoresist film, the film is post-cured employing microwave radiation at a nominal power of about 400 watts for a time period ranging from about two minutes to about five minutes.

3. The process of claim 1 wherein said substrate comprises GaAs having an oxide layer on the surface to be coated with photoresist, said oxide layer being either a natural oxide or a layer of $SiO_2$.

4. A process for preventing developer undercutting in photoresist masks for GaAs semiconductor devices, said process comprising:
    applying a photoresist film having a thickness of about 1.4 microns to a surface of a substrate comprising GaAs which has a surface region of oxide curing the film by subjecting the photoresist-coated substrate to microwave-radiation of a nominal power of about 400 watts for a period of time ranging about two minutes to about five minutes;
    exposing portions of the photoresist film either to electromagnetic radiation of sufficient intensity or to a beam of appropriately energetic electrons to expose portions of the photoresist film; and
    developing the photoresist film to remove portions thereof wherein undercutting of the remaining photoresist film is substantially reduced.

* * * * *